US008770793B2

(12) United States Patent
Mizuta et al.

(10) Patent No.: US 8,770,793 B2
(45) Date of Patent: Jul. 8, 2014

(54) LED BULB

(75) Inventors: Kohei Mizuta, Kyoto (JP); Saizo Suzuki, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 208 days.

(21) Appl. No.: 13/415,323

(22) Filed: Mar. 8, 2012

(65) Prior Publication Data

US 2012/0230041 A1    Sep. 13, 2012

(30) Foreign Application Priority Data

Mar. 11, 2011  (JP) .................... 2011-054095

(51) Int. Cl.
*F21V 29/00*  (2006.01)
*F21V 15/01*  (2006.01)
*H01L 27/15*  (2006.01)
*G02B 6/00*   (2006.01)

(52) U.S. Cl.
USPC ...... 362/249.02; 362/362; 362/373; 362/294; 362/800

(58) Field of Classification Search
USPC ............... 362/249.02, 294, 362, 373, 800
See application file for complete search history.

(56) References Cited

U.S. PATENT DOCUMENTS

| 6,220,722 B1* | 4/2001 | Begemann ............... 362/231 |
| 8,258,524 B2* | 9/2012 | Tan et al. .................. 257/95 |
| 8,496,349 B2* | 7/2013 | Wu et al. .............. 362/249.02 |
| 2009/0257220 A1* | 10/2009 | Lenk et al. ................. 362/186 |
| 2010/0283369 A1* | 11/2010 | Chen .............................. 313/1 |
| 2011/0089831 A1* | 4/2011 | Takahasi et al. ............. 315/35 |
| 2012/0147624 A1* | 6/2012 | Li et al. ..................... 362/609 |

FOREIGN PATENT DOCUMENTS

| JP | 2010-135308 | 6/2010 |
| JP | 2010-135309 | 6/2010 |

* cited by examiner

*Primary Examiner* — Stephen F Husar
*Assistant Examiner* — James Cranson, Jr.
(74) *Attorney, Agent, or Firm* — Hamre, Schumann, Mueller & Larson, P.C.

(57) ABSTRACT

The present invention provides an LED bulb, which includes a light source portion including at least one LED chip); a housing including a bottom portion supporting the light source portion and a sidewall portion surrounding the light source portion, and opening at one side of a first direction; a base disposed on the other side of the first direction relative to the housing; and a light guide body disposed in a space surrounded by the sidewall portion, and including an incident surface facing the light source portion, a light-emitting surface for making the light from the incident surface emit toward the one side of the first direction, and a peripheral side surface located between the incident surface and the light-emitting surface, wherein the cross-sectional area of the peripheral side surface becomes increasingly larger from a side of the incident surface toward a side of the light-emitting surface.

26 Claims, 16 Drawing Sheets

LED BULB

BACKGROUND OF THE INVENTION

1. Field of the Invention

The present invention relates to a light emitting diode (LED) bulb including LED chip adopted for the light source.

2. Description of the Related Art

FIG. 22 shows an example of conventional LED bulb (see Patent Documents 1 and 2, for example). The LED bulb 900 illustrated in the figure includes a plurality of LED modules 901, a globe 902, a heat-dissipating element 903 and a base 904. The LED module 901 is the light emitting device of the LED bulb 900, and includes at least one LED chip (not shown in the figure) therein. The globe 902 makes the light from the LED modules 901 diffuse and pass through. The heat-dissipating element 903 is the element, e.g., including aluminum, used for dissipating the heat from the LED modules 901. The base 904 is the portion used for mounting the LED bulb 900 to the incandescent bulb lighting fixture. When being turned on, the LED bulb 900 exhibits the appearance of the incandescent bulb by making the globe 902 illuminate evenly.

In addition to the incandescent bulb, e.g., the halogen lamp, are the lamp that is mounted on the lighting fixture. The illumination field of the halogen lamp is narrower than that of the incandescent bulb, and the halogen lamp is, e.g., mounted on the indoor lighting fixture which is called down light. Although the LED bulb 900 is adapted for illuminating a wider field, its illumination field is preferably to be limited to a narrower range in order to be used as the down light.

Patent Document 1: Japanese Patent Publication No. 2010-135308.

Patent Document 2: Japanese Patent Publication No. 2010-135309.

SUMMARY OF THE INVENTION

Problems to be Solved by the Invention

In view of the above-described conventional problems, a technical object of the present invention is to provide an LED bulb which is adapted to be used as a replacement for the halogen lamp.

Technical Means for Solving the Problems

The LED bulb provided by the present invention comprises: a light source portion, comprising at least one LED chip; a housing, comprising a bottom portion supporting the light source portion and a sidewall portion surrounding the light source portion, and opening at one side of a first direction; a base, disposed on the other side of the first direction respective to the housing; and a light guide body, disposed in a space surrounded by the sidewall portion, and comprising an incident surface facing the light source portion, a light-emitting surface for making the light from the incident surface emit toward the side of the first direction, and a peripheral side surface located between the incident surface and the light-emitting surface, wherein the cross-sectional area of the peripheral side surface becomes increasingly larger from a side of the incident surface toward a side of the light-emitting surface.

In a preferred embodiment of the present invention, the light source portion further comprises a light-transmitting resin covering the LED chip and allowing the light from the LED chip to pass through.

In a preferred embodiment of the present invention, the light-transmitting resin contains a fluorescent material, the fluorescent material is excited by the light from the LED chip and emits a light having a wavelength that is different from the light from the LED chip.

In a preferred embodiment of the present invention, the light-transmitting resin is in a shape of dome.

In a preferred embodiment of the present invention, the light source portion further comprises a lead carrying the LED chip and a case covering at least one part of the lead.

In a preferred embodiment of the present invention, the incident surface of the light guide body is a recessed surface that is recessed toward the one side of the first direction, and accommodates the light source portion.

In a preferred embodiment of the present invention, the light-emitting surface of the light guide body comprises a recessed surface overlapping the incident surface as viewed in the first direction and being recessed toward the other side of the first direction.

In a preferred embodiment of the present invention, the light-emitting surface of the light guide body comprises a plurality of lens surfaces, each being in shape of dome.

In a preferred embodiment of the present invention, the light source portion further comprises a LED substrate carrying a plurality of LED chips, and a weir portion formed on the LED substrate to surround the LED chips; and the light-transmitting resin is formed in an area surrounded by the weir portion, and comprises a flat light-emitting surface toward the one side of the first direction.

In a preferred embodiment of the present invention, the light-emitting surface of the light-transmitting resin is located further on the other side of the first direction than the end of weir portion at the one side of the first direction.

In a preferred embodiment of the present invention, the light guide body further comprises a ring groove surrounding the incident surface and engaging the weir portion.

In a preferred embodiment of the present invention, the incident surface of the light guide body is a recessed surface that is recessed toward the one side of the first direction and is spaced apart from the light-emitting surface of the light-transmitting resin.

In a preferred embodiment of the present invention, the incident surface of the light guide body comprises a circular bottom surface and a side surface with a circular cross-section.

In a preferred embodiment of the present invention, the light-emitting surface of the light guide body comprises a recessed surface overlapping the incident surface as viewed in the first direction and being recessed toward the other side of the first direction.

In a preferred embodiment of the present invention, the light-emitting surface of the light guide body comprises a plurality of lens surfaces, each being in shape of dome.

In a preferred embodiment of the present invention, the incident surface of the light guide body is smaller than the light-emitting surface of the light-transmitting resin.

In a preferred embodiment of the present invention, the incident surface of the light guide body and the light-emitting surface of the light-transmitting resin are in contact with each other.

In a preferred embodiment of the present invention, the sidewall portion is bright white.

In a preferred embodiment of the present invention, further comprising a holder having a shape of surrounding a part of the light guide body at the one side of the first direction, and the light guide body being held between the holder and the bottom portion of the housing; wherein the holder is mounted on the housing.

In a preferred embodiment of the present invention, the housing further comprises a female screw formed on the sidewall portion, and the holder comprises a male screw threadably engaged with the female screw of the housing.

In a preferred embodiment of the present invention, the housing further comprises a heat-dissipating element constituting the bottom portion and the sidewall portion and being made of metal.

In a preferred embodiment of the present invention, the heat-dissipating element comprises a plurality of fins.

In a preferred embodiment of the present invention, further comprising a power source providing electric power to the LED chip; and the housing further comprising a power source accommodating portion mounted on the other side of the first direction relative to the heat-dissipating element, wherein the power source accommodating portion accommodates the power source and is made of resin.

In a preferred embodiment of the present invention, the sidewall portion of the housing comprises an inner side surface surrounding the peripheral side surface of the light guide body with a gap therebetween.

In a preferred embodiment of the present invention, the cross-sectional area of the inner side surface becomes increasingly larger toward the one side of the first direction.

In a preferred embodiment of the present invention, wherein the inner side surface is a bright white surface or a metallic luster surface.

According to this structure, the light from the light source portion emits toward the one side of the first direction from the light-emitting surface of the light guide body. Therefore, it can emit selectively to the desired field rather than emitting all directions of the periphery of the LED bulb. Therefore, the LED bulb, e.g. is adapted to be used as a replacement for the halogen lamp to be mounted on the lighting fixture such as down light.

Other features and advantages of the present invention will become more apparent from the following detailed description with reference to the accompanying drawings.

DETAILED DESCRIPTION OF THE INVENTION

Figure 1:
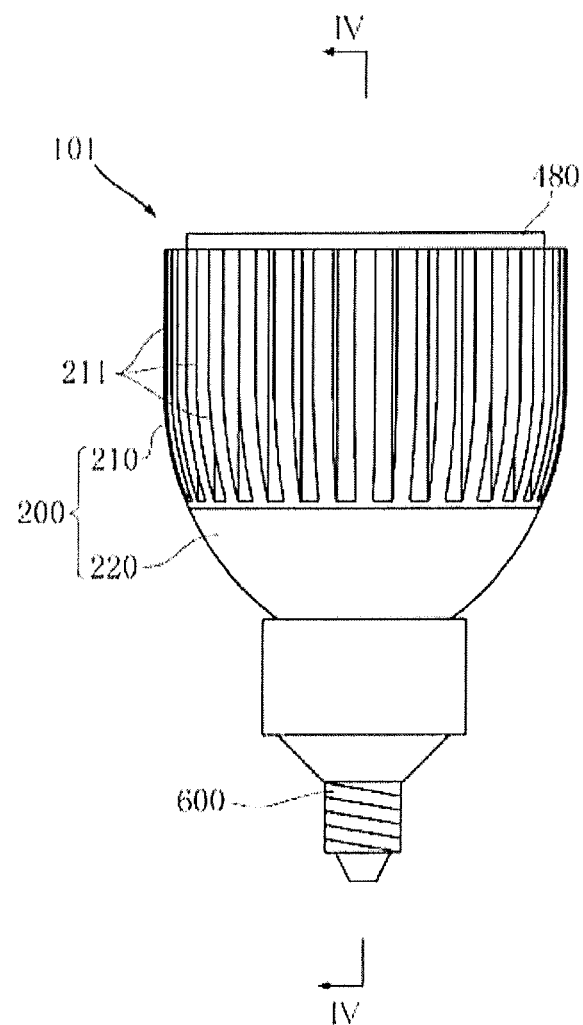
FIG. 1 is a front view showing a LED bulb according to a first embodiment of the present invention.
Figure 2:
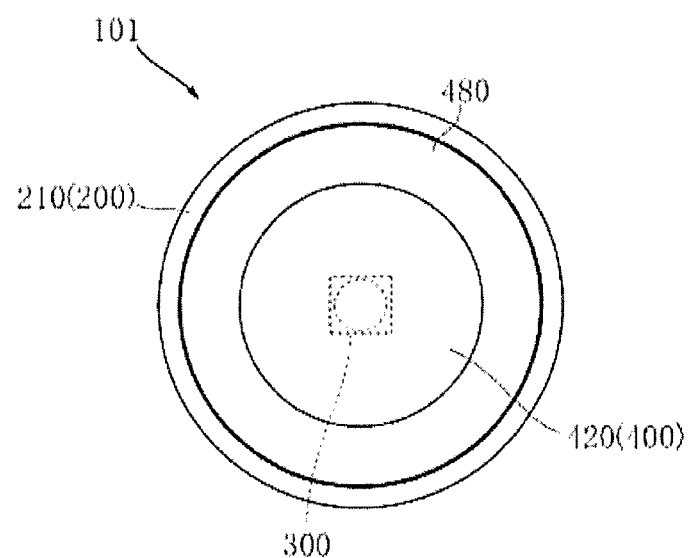
FIG. 2 is a plain view showing the LED bulb of FIG. 1.
Figure 3:
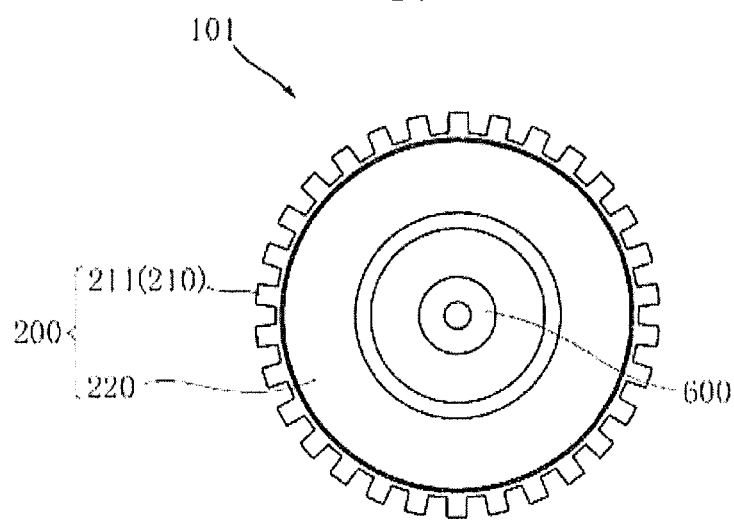
FIG. 3 is a bottom view showing the LED bulb of FIG. 1.

Preferred embodiments of the present invention will be described below in detail with reference to the accompanying drawings.

FIG. 1 to FIG. 4 show a LED bulb according to a first embodiment of the present invention. The LED bulb 101 of this embodiment comprises a housing 200, a light source portion 300, a light guide body 400, a power source 500 and a base 600. The LED bulb 101, e.g. is used as a replacement for the halogen lamp to be mounted on the lighting fixture such as down light.

Figure 4:
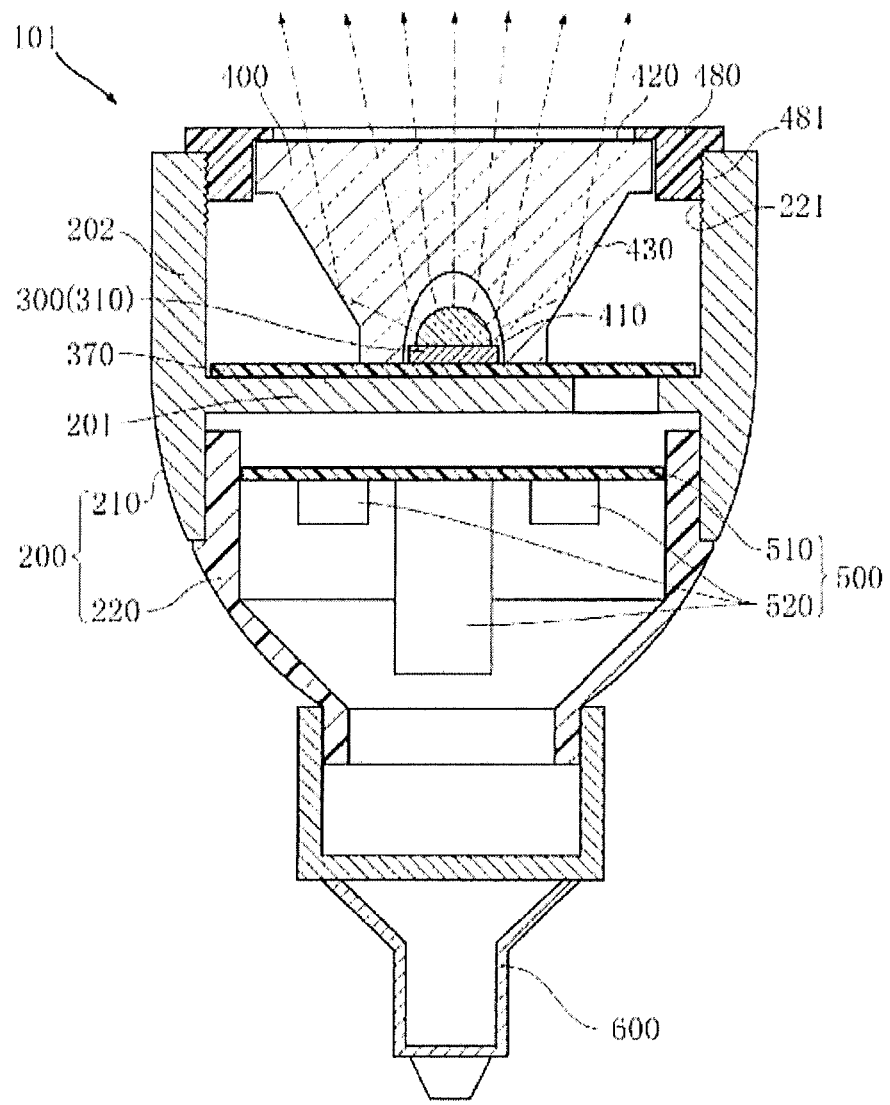
FIG. 4 is a cross-sectional view taken along line IV-IV of FIG. 1.

The housing 200 is a primary element of the LED bulb 101, and in this embodiment, comprises a heat-dissipating element 210 and a power source accommodating portion 220. The heat-dissipating element 210, e.g. includes a metal such as aluminum, and includes a bottom portion 201 and a sidewall portion 202 as shown in FIG. 4. The bottom portion 201 is a circular plate which supports the light source portion 300. The sidewall portion 202 is a cylinder which surrounds the bottom portion 201. A female screw 221 is formed on the inner side of the upper portion of the sidewall portion 202 in the figure. As shown in FIG. 1, a plurality of fins 211 are formed on the outer surface of the heat-dissipating element 210. The inner surface of the sidewall portion 210 is set to dark color such as black.

The power source accommodating portion 220, e.g. includes a resin such as polycarbonate, and is a cylinder whose diameter becomes smaller toward the bottom of the figure. The power source accommodating portion 220 is mounted on the heat-dissipating element 210 through spiral engagement caused by the screw (not shown) formed respectively or through adhesion.

Figure 5:
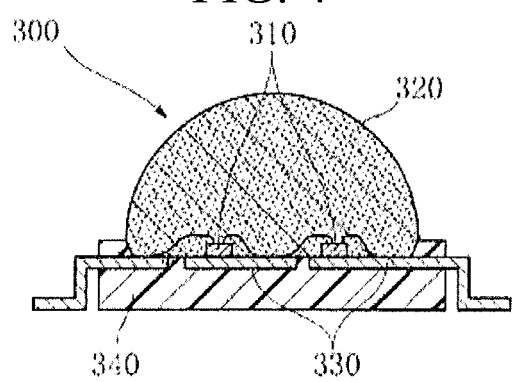
FIG. 5 is a cross-sectional view showing a light source portion used in the LED bulb of FIG. 1.

The light source portion 300 is the light source of the LED bulb 101, and as shown in FIG. 4, is supported by the bottom portion 201 of the housing 200 with a light source substrate 370 disposed therebetween. As shown in FIG. 5, the light source portion 300 comprises a plurality of LED chips 310, a light-transmitting resin 320, a lead 330 and a case 340.

The LED chip 310 includes a n-type semiconductor layer, a p-type semiconductor layer and an active layer sandwiched between the n-type semiconductor layer and the p-type semiconductor layer having, e.g. GaN series semiconductor material, and, e.g. emits blue light. The lead 330, e.g. includes the metal such as Cu alloy or Fe alloy, and carries a plurality of LED chips 310. The LED chips 310 are connected to the proper portion of the lead 330 by the connecting wires.

The case 340, e.g. includes white resin which covers a part of the lead 330. A portion of the lead 330 exposed from the case 340 is used as a terminal that carries the light source portion 300 on the light source substrate 370. The light-transmitting resin 320 covers a plurality of LED chips 310, and is formed on the case 340. The light-transmitting resin 320 is in a shape of dome, and e.g. includes a transparent epoxy resin containing a fluorescent material. The fluorescent material emits yellow light when excited by the blue light from the LED chip 310.

Figure 6:
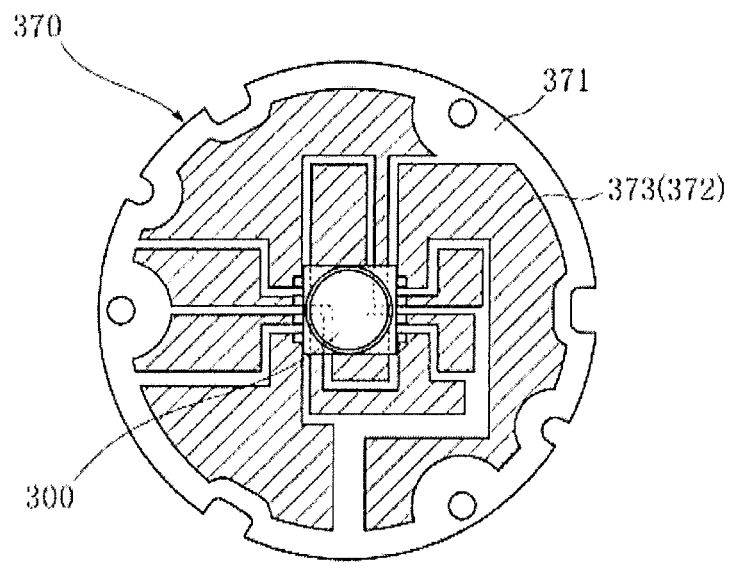
FIG. 6 is a plain view showing a light source substrate of the light source portion used in the LED bulb of FIG. 1.
Figure 7:
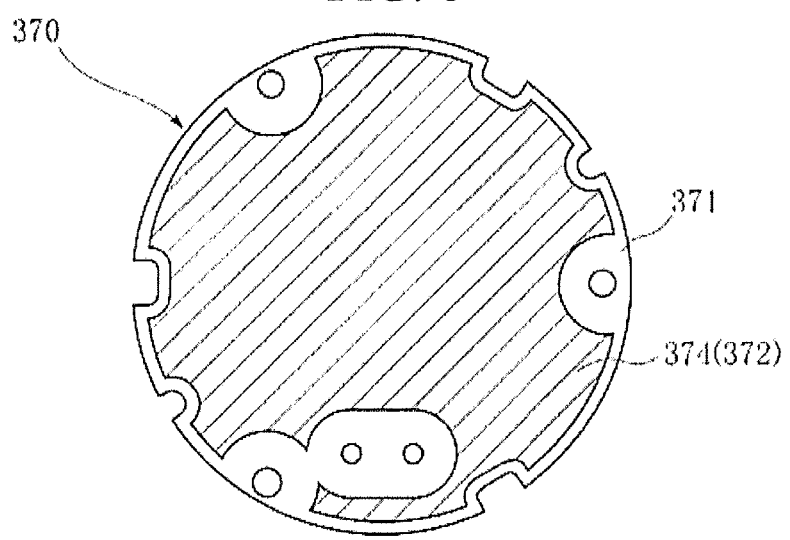
FIG. 7 is a bottom view showing a light source substrate of the light source portion used in the LED bulb of FIG. 1.

The light source substrate 370 is mounted on the bottom portion 201 of the housing 200 by, e. g. adhesive paste or adhesive film, and includes a substrate 371 and a metal layer 372, as shown in FIG. 6 and FIG. 7. The substrate 371, e.g. includes glass epoxy resin or aluminum with surface insulation treatment, and is substantially circular. The metal layer 372 is a plating layer, e.g. laminated by Cu, Ni and Au, and includes a layout pattern 373 and a heat-dissipating pattern 374. The layout pattern 373 is formed on one side surface of the substrate 371, and is used for carrying the light source portion 300 and providing electric power to the light source portion 300. The heat-dissipating pattern 374 is formed on the other side surface of the substrate 371, and is formed by covering almost the whole area of the surface.

The light guide body 400, e.g. includes a transparent epoxy resin, and as shown in FIG. 4, is disposed in a space surrounded by the sidewall portion 202 of the housing 200. The light guide body 400 includes an incident surface 410, a light-emitting surface 420 and a peripheral side surface 430. The incident surface 410 is disposed on the bottom portion of the light guide body 400 and corresponds to the light source portion 300. In this embodiment, the incident surface 410 is a recessed surface that is recessed upward, and accommodates the light source portion 300. The light from the light source portion 300 is incident to the incident surface 410. The light-emitting surface 420 is disposed on the top portion of the light guide body 400, and in this embodiment, is a circular plane. The incident light from the incident surface 410 travels in the light guide body 400, and then emits out from the light-emitting surface 420. The peripheral side surface 430 is located between the incident surface 410 and the light-emitting surface 420, and is a cylinder whose cross-sectional area becomes larger from lower portion toward upper portion.

The light guide body 400 is pressed to fix to the bottom portion 201 with a light source substrate 370 disposed therebetween. The press is accomplished by a holder 480. The holder 480 is a ring element, e.g. including resin, and engages the light guide body 400 loosely. A male screw 481 is formed on the holder 480. When the male screw 481 threadably engages with the female screw 221 of the housing 200, the holder 480 is mounted on the housing 200. If the holder 480 is fastened to the housing 200, the light guide body 400 is held between the holder 480 and the bottom portion 201.

The power source 500 provides electric power to the light source portion 300, and includes a power source substrate 510 and a plurality of electronic components 520. The power source substrate 510, e.g. includes a glass epoxy resin, is accommodated in the power source accommodating portion 220 of the housing 200, and is mounted on the power source accommodating portion. The electronic components 520 is mounted on the power source substrate 510, and e.g. includes transformer, capacitor, diode, resistor, integrated circuit (IC) chip.

The base 600 is used to mount the LED bulb 101 on the lighting fixture such as down light, receives the external electric power, and, e.g. complies with the industrial standard such as JIS (Japanese Industrial Standards). The base 600 generally includes a tube portion having insulating material and a screw portion made of metal and mounted on the bottom thereof.

Further, the operation of the LED bulb 101 is described as follows.

According to this embodiment, the light from the light source portion 300 emits toward the top of FIG. 4 from the light-emitting surface 420 of the light guide body 400. Therefore, it can emit selectively to the desired field rather than emitting all directions of the periphery of the LED bulb 101. Therefore, the LED bulb 101, e.g. is adapted to be used as a replacement for the halogen lamp to be mounted on the lighting fixture such as down light.

Since the light-transmitting resin 320 of the light source portion 300 is in a shape of dome, the light from the LED chip 310 can concentrate upward. Further, the incident surface 410 of the light guide body 400 is a recessed surface that accommodates the light source portion 300 so that almost all light from the light source portion 300 is incident to the light guide body 400, thereby facilitating the high brightness of the LED bulb 101. The peripheral side surface 430 guides the light traveling upward obliquely from the light source portion 300 to the light-emitting surface 420 due to the total reflection.

The heat generated by the light source portion 300 can be conducted to the sidewall portion 202 from the bottom portion 201 rapidly because the housing 200 includes the heat-dissipating element 210 having metal. The fins 211 facilitate dissipating the heat outside. Moreover, the light weight of the LED bulb 101 can be accomplished because the housing 200 includes the power source accommodating portion 220 having resin.

FIG. 8 to FIG. 21 show the other embodiments of the present invention. In addition, the same or similar elements of the embodiments in these figures are designated with the same reference numerals.

Figure 8:
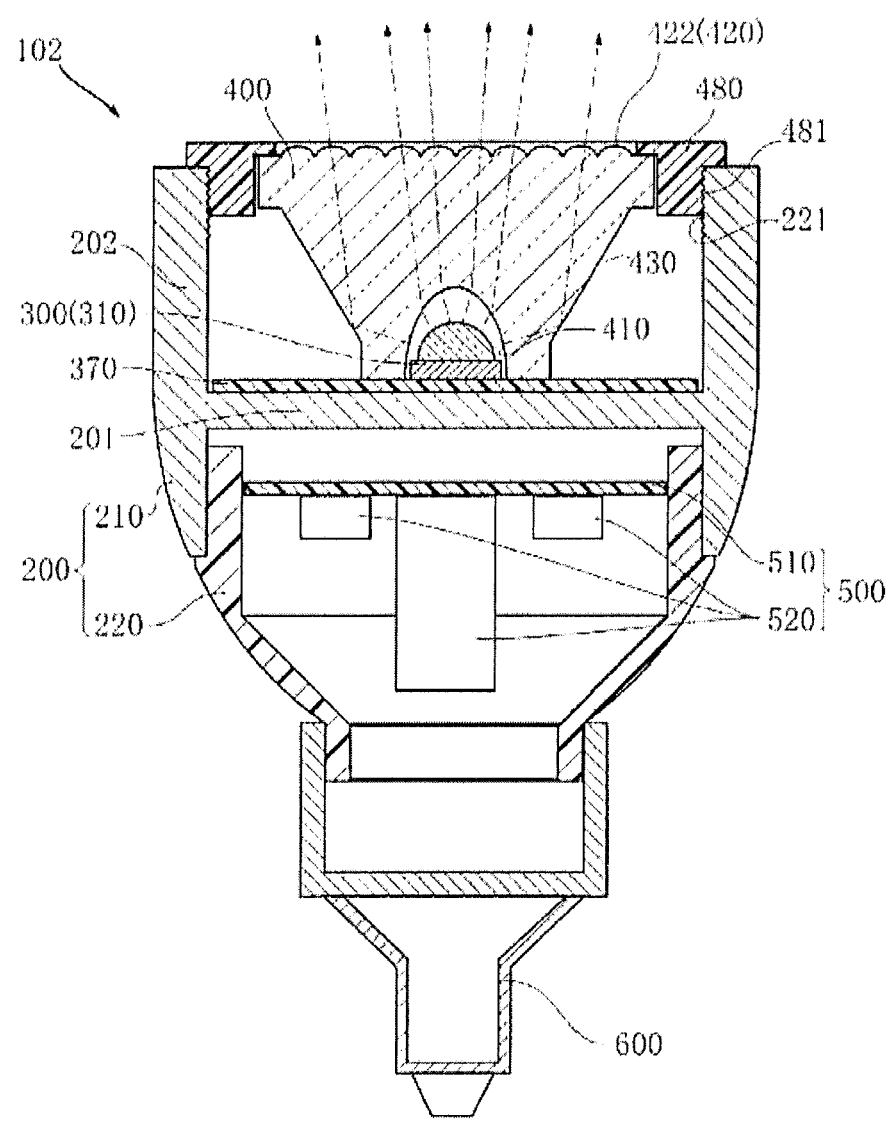
FIG. 8 is a cross-sectional view showing a LED bulb according to a second embodiment of the present invention.
Figure 9:
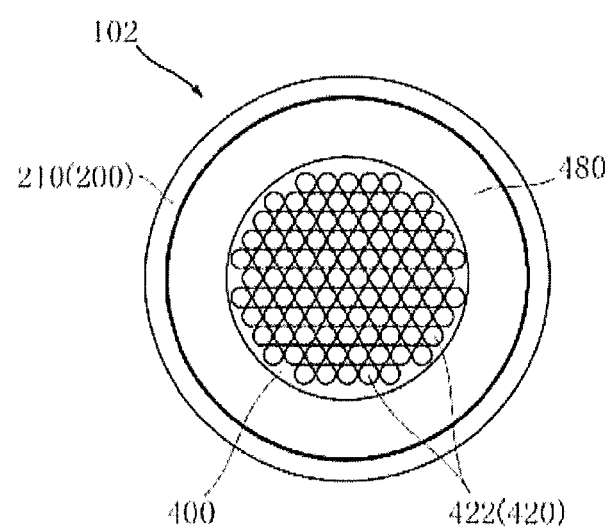
FIG. 9 is a plain view showing the LED bulb of FIG. 8.

FIG. 8 and FIG. 9 show a LED bulb according to a second embodiment of the present invention. The difference between the LED bulb 102 of this embodiment and the foregoing embodiment is the structure of the light-emitting surface 420 of the light guide body 400. In this embodiment, the light-emitting surface 420 includes a plurality of lens surfaces 422. The lens surfaces 422 are in shape of dome with small size respectively, and are arranged in the manner of being adjacent to each other and being evenly spaced apart from each other as shown in FIG. 9.

According to this embodiment, the LED bulb 102 may also be used as a replacement for the halogen lamp. Moreover, the illuminance in the illumination field can be further raised by including the lens surfaces 422.

Figure 10:
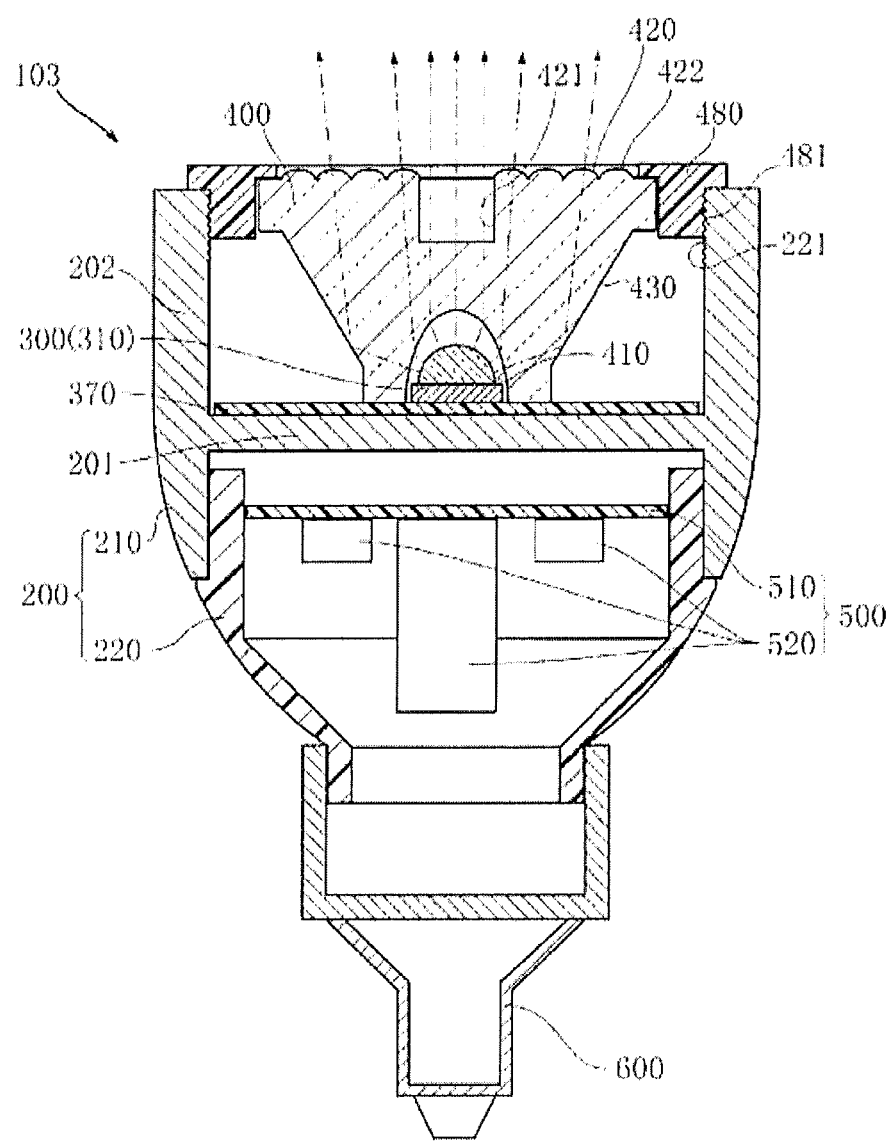
FIG. 10 is a cross-sectional view showing a LED bulb according to a third embodiment of the present invention.
Figure 11:
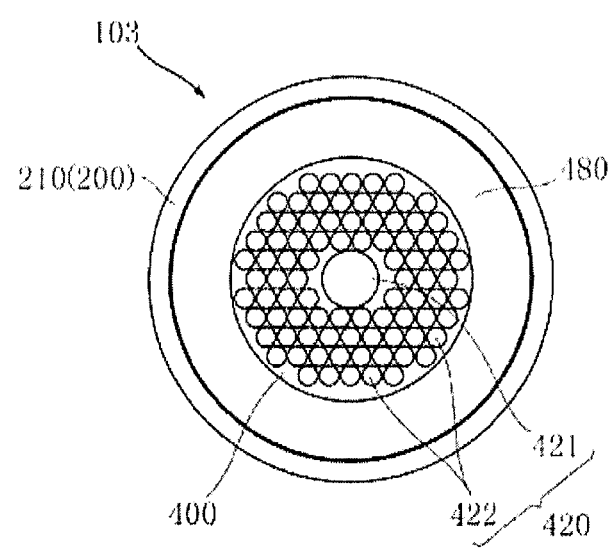
FIG. 11 is a plain view showing the LED bulb of FIG. 10.

FIG. 10 and FIG. 11 show a LED bulb according to a third embodiment of the present invention. The difference between the LED bulb 103 of this embodiment and the foregoing embodiment is the structure of the light-emitting surface 420 of the light guide body 400. In this embodiment, the light-emitting surface 420 includes a recessed surface 421 and a plurality of lens surfaces 422. The recessed surface 421 is recessed downward from the top end of the light guide body 400, and has a circular cross-section as shown in FIG. 11. The recessed surface 421 of the light-emitting surface 420 overlaps the incident surface 410 from a top view.

According to this embodiment, the LED bulb 103 may also be used as a replacement for the halogen lamp. Moreover, since the light-emitting surface 420 includes the recessed surface 421, the light that is incident through the incident surface 410 and travels upward straightly will emit out from the recessed surface 421 rapidly. This embodiment is adapted for restraining the light that travels upward straightly from diffusing undesirably in the light guide body 400.

FIG. 12 to FIG. 15 show a LED bulb according to a fourth embodiment of the present invention. The difference between the LED bulb 104 of this embodiment and the foregoing embodiment is the structures of the housing 200, the light source portion 300 and the light guide body 400.

Figure 12:
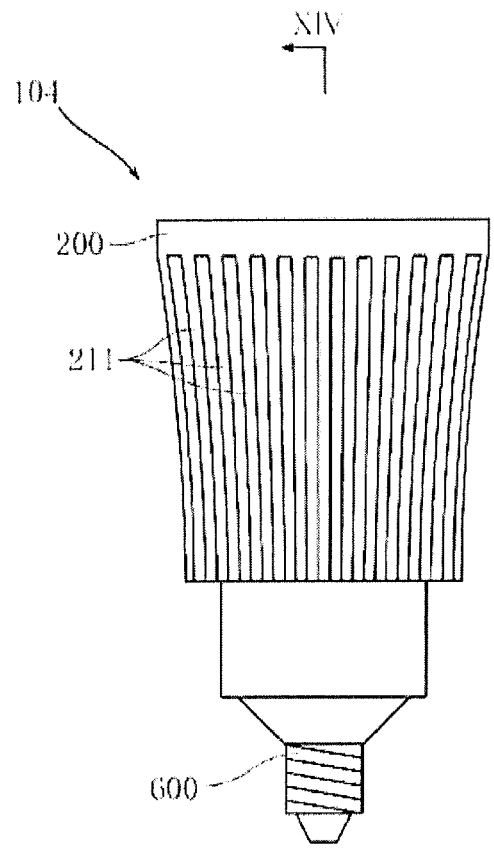
FIG. 12 is a front view showing a LED bulb according to a fourth embodiment of the present invention.
Figure 13:
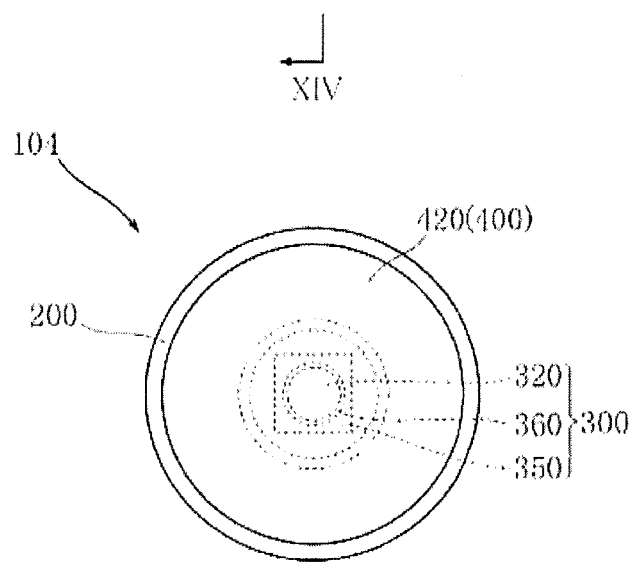
FIG. 13 is a plain view showing the LED bulb of FIG. 12.
Figure 14:
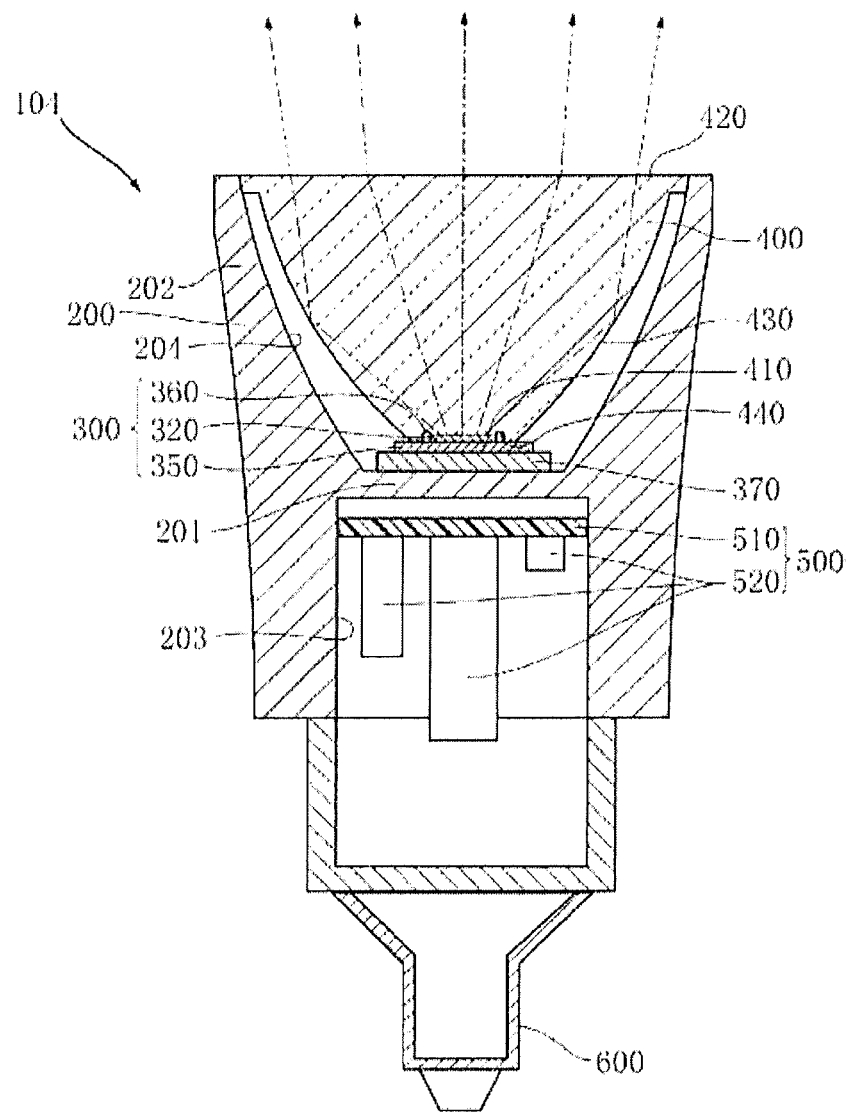
FIG. 14 is a cross-sectional view taken along line XIV-XIV of FIG. 12.

In this embodiment, the housing 200 is made integrally of metal such as aluminum. As shown in FIG. 12, a plurality of fins 211 are formed on the outer surface of the housing 200 longitudinally with a length approximated to the total length of the housing 200. Further, a recessed portion 203 which opens downward is formed on the housing 200. The recessed portion 203 accommodates the power source 500. The sidewall portion 202 of the housing 200 includes an inner side surface 204. The inner side surface 204 surrounds the peripheral side surface 430 of the light guide body 400 with a gap therebetween. The inner side surface 204 is a cylinder whose cross-sectional becomes larger from the lower portion toward the upper portion, and is in a configuration alongside the peripheral side surface 430 of the light guide body 400. The inner side surface 204 is a bright white surface with white color or a metallic luster surface formed by metal plating.

Figure 15:
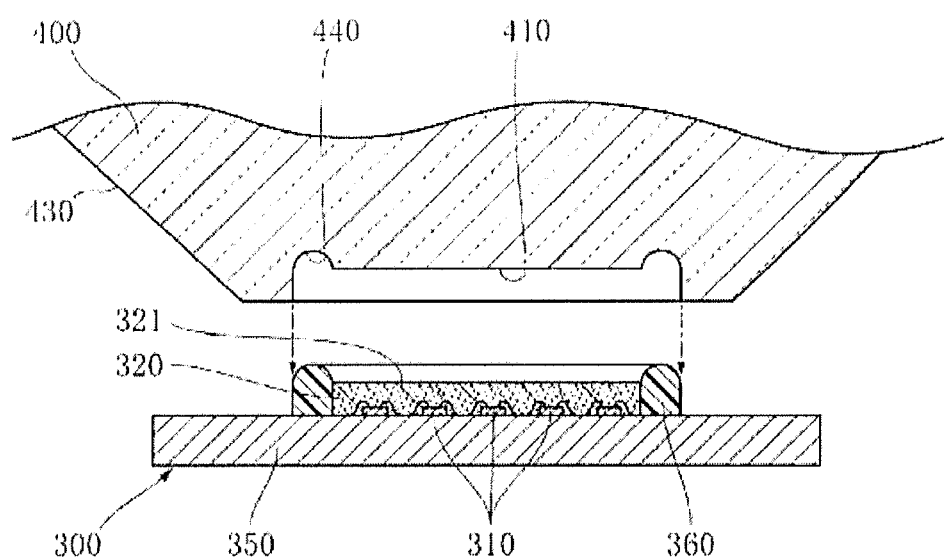
FIG. 15 is an enlarged cross-sectional view showing main part of the light source portion and the light guide body used in the LED bulb of FIG. 12.

As shown in FIG. 15, the light source portion 300 includes a LED substrate 350, a plurality of LED chips 310, a weir portion 360 and a light-transmitting resin 320. The LED substrate 350 includes ceramics, metal such as aluminum with surface insulation treatment or glass epoxy resin, and is rectangular. The LED chips 310 are carried on the LED substrate 350 with e.g. a matrix arrangement. The weir portion 360, e.g. includes organic silicone resin, and is formed as a ring shape on the LED substrate is 350 to surround the LED chips 310. The light-transmitting resin 320 is filled in the area surrounded by the weir portion 360 so as to cover the LED chips 310. The light-transmitting resin 320 has a light-emitting surface 321. The light-emitting surface 321 is a flat circular surface, and in this embodiment, is located at a position lower than the upper end of the weir portion 360. The light-transmitting resin 320 is formed by, e.g. injecting a liquid resin material on the LED substrate 350 after finishing the carrying of the LED chips 310 and the formation of the weir portion 360, and then curing it.

In this embodiment, the light source substrate 370 includes metal such as aluminum or ceramic. Alternatively, the light source portion 300 may be mounted on the bottom portion 201 directly without the light source substrate 370 disposed therebetween.

In addition to the incident surface 410, the light-emitting surface 420 and the peripheral side surface 430, the light guide body 400 includes a ring groove 440. The ring groove 440 is formed at the bottom end of the light guide body 400, and surrounds the incident surface 410. The ring groove 440 engages the weir portion 360 of the light source portion 300. When the ring groove 440 engages the weir portion 360, the incident surface 410 of the light guide body 400 is in contact with the light-emitting surface 321 of the light-transmitting resin 320 of the light source portion 300. The light guide body 400 is fixed by, e.g. adhering to the housing 200.

According to this embodiment, the LED bulb 104 may also be used as a replacement for the halogen lamp. The constitution of connecting the incident surface 410 and the light-emitting surface 321 of the light-transmitting resin 320 of the light source portion 300 can prevent the light from totally reflecting between the light-transmitting resin 320 and the light guide body 400. The engagement between the ring groove 440 of the light guide body 400 and the weir portion 360 of the light source portion 300 can permit precisely positioning of the light source portion 300 and the light guide body 400. As shown in FIG. 15, since the light-emitting surface 321 of the light-transmitting resin 320 is located at a position lower than the upper end of the weir portion 360, the connection between the light-emitting surface 321 and the incident surface 410 is secured. The light that is not totally reflected by the peripheral side surface 430 of the light guide body 400 and then passes through the peripheral side surface 430 is incident to the inner side surface 204 of the sidewall portion 202 through the gap. Although the inner side surface 204 is not parallel to the peripheral side surface 430 strictly, the angle therebetween is very small. Therefore, the incident angle of the light that is not totally reflected by the peripheral side surface 430 with respect to the inner side surface 204 is relatively small. Thus, the incident angle of the light that is reflected by the inner side surface 204 with respect to the peripheral side surface 430 is also relatively small. As a result, the light will be incident into the light guide body 400 again. This embodiment is adapted for increasing the proportion of emitting light from the light-emitting surface 420.

Figure 16:
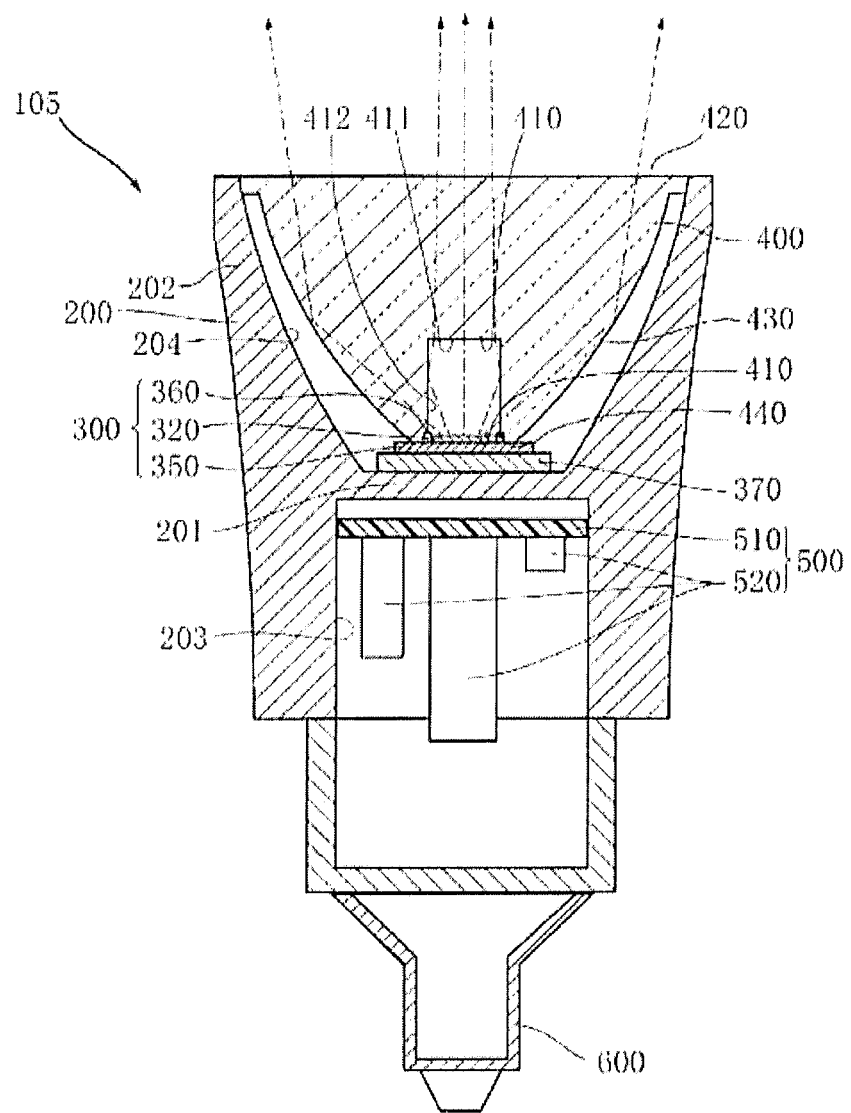
FIG. 16 is a cross-sectional view showing a LED bulb according to a fifth embodiment of the present invention.

FIG. 16 shows a LED bulb according to a fifth embodiment of the present invention. The difference between the LED bulb 105 of this embodiment and the foregoing LED bulb 104 is the structure of the light guide body 400. In this embodiment, the incident surface 410 of the light guide body 400 is a recessed surface that has a bottom surface 411 and a side surface 412. The bottom surface 411 is at a deep position upward from the lowermost end of the light guide body 400, and is circular. The side surface 412 is a cylinder whose shape and size in cross section are the same as the bottom surface 411. In this embodiment, the bottom end of the side surface 412 is consistent with the outer edge of the light-emitting surface 321 because the light-emitting surface 321 of the light-transmitting resin 320 of the light source portion 300 is accommodated in the side surface 412, or bottom surface 411 and the light-emitting surface 321 have the same shape and size.

According to this embodiment, the LED bulb 105 may also be used as a replacement for the halogen lamp. Further, the light that reaches at the bottom surface 411 of the incident surface 410 is the light that travels substantially right upward from the light source portion 300. Such light has a low possibility of being totally reflected by the bottom surface 411. The light having a relatively greater incident angle with respect to the side surface 412 will be totally reflected by the side surface 412, and then enters the bottom surface 411. Therefore, this embodiment is adapted for raising the illuminance in the illumination field, especially the central portion.

Figure 17:
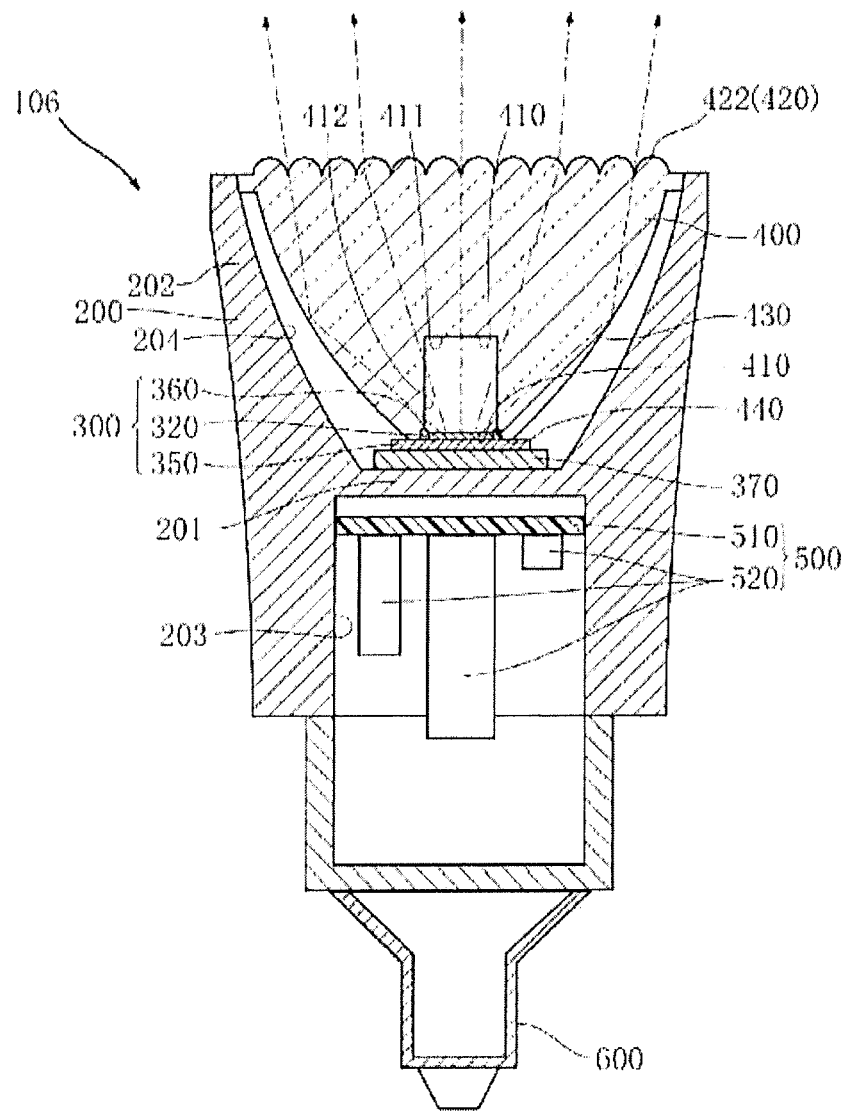
FIG. 17 is a cross-sectional view showing a LED bulb according to a sixth embodiment of the present invention.
Figure 18:
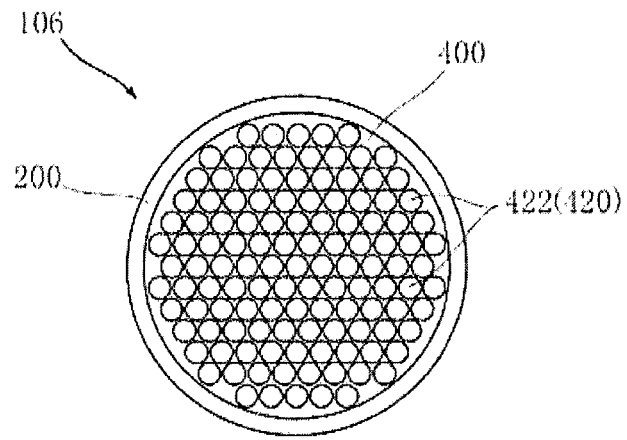
FIG. 18 is a plain view showing the LED bulb of FIG. 17.

FIG. 17 and FIG. 18 show a LED bulb according to a sixth embodiment of the present invention. The difference between the LED bulb 106 of this embodiment and the foregoing LED bulbs 104,105 is the structure of the light-emitting surface 420 of the light guide body 400. In this embodiment, the light-emitting surface 420 includes a plurality of lens surfaces 422 as does the foregoing LED bulb 102. The lens surfaces 422 are in shape of dome with small size respectively, and are arranged in the manner of being adjacent to each other and being evenly spaced apart from each other as shown in FIG. 18.

According to this embodiment, the LED bulb 106 may also be used as a replacement for the halogen lamp. Moreover, the illuminance in the illumination field can be further raised by including the lens surfaces 422.

Figure 19:
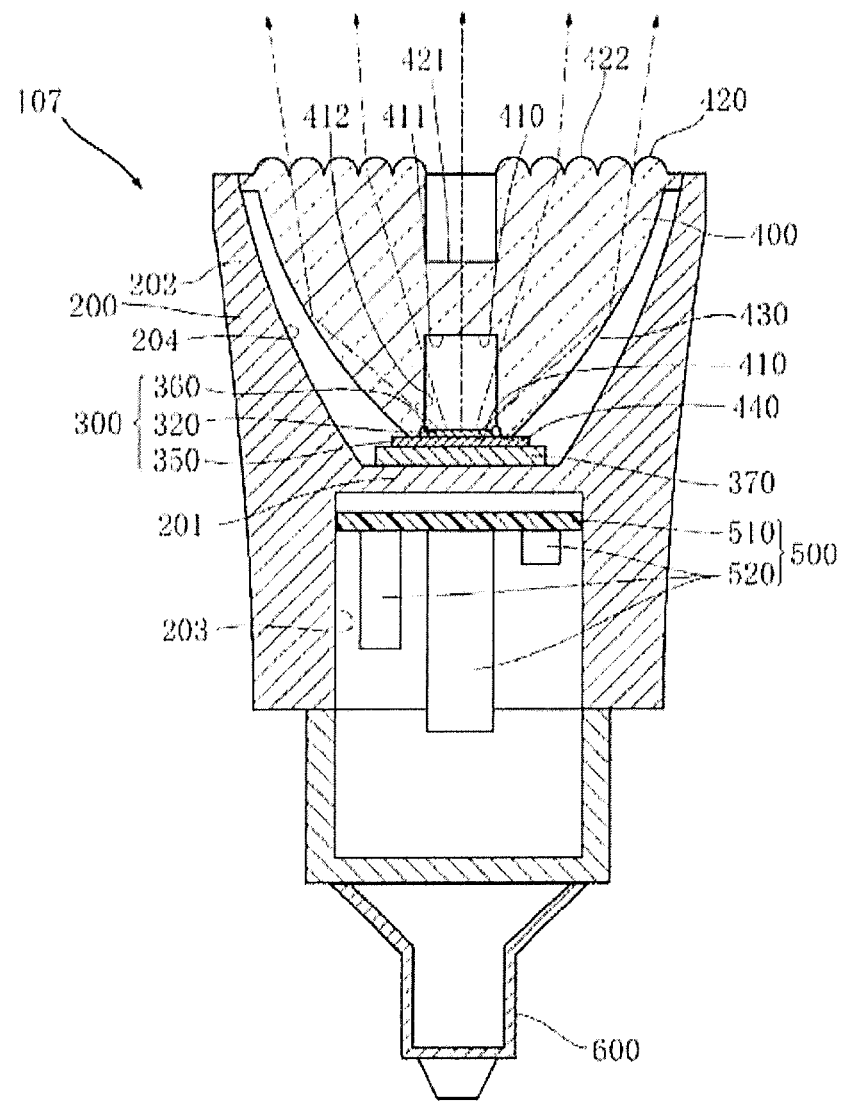
FIG. 19 is a cross-sectional view showing a LED bulb according to a seventh embodiment of the present invention.
Figure 20:
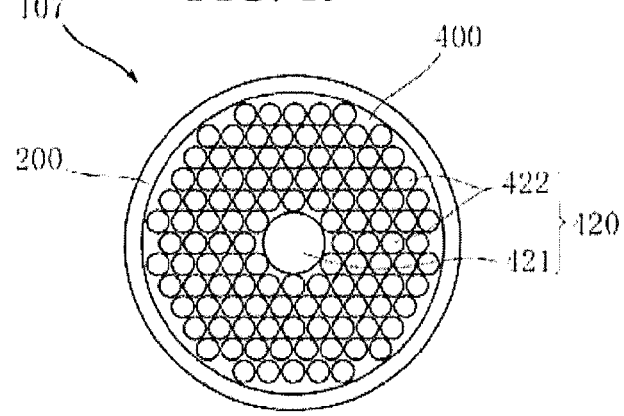
FIG. 20 is a plain view showing the LED bulb of FIG. 19.

FIG. 19 and FIG. 20 show a LED bulb according to a seventh embodiment of the present invention. The difference between the LED bulb 107 of this embodiment and the foregoing LED bulbs 104-106 is the structure of the light-emitting surface 420 of the light guide body 400. In this embodiment, the light-emitting surface 420 includes a recessed surface 421 and a plurality of lens surfaces 422 as does the foregoing LED bulb 103. The recessed surface 421 is recessed downward from the top end of the light guide body 400, and has a circular cross-section as shown in FIG. 20. The recessed surface 421 of the light-emitting surface overlaps the incident surface 410 from a top view.

According to this embodiment, the LED bulb 107 may also be used as a replacement for the halogen lamp. Moreover, since the light-emitting surface 420 includes the recessed surface 421, most of the light that is incident to the bottom surface 411 of the incident surface 410 will emit out from the recessed surface 421 rapidly. This embodiment is adapted for restraining the light that travels upward straightly from diffusing undesirably in the light guide body 400.

Figure 21:
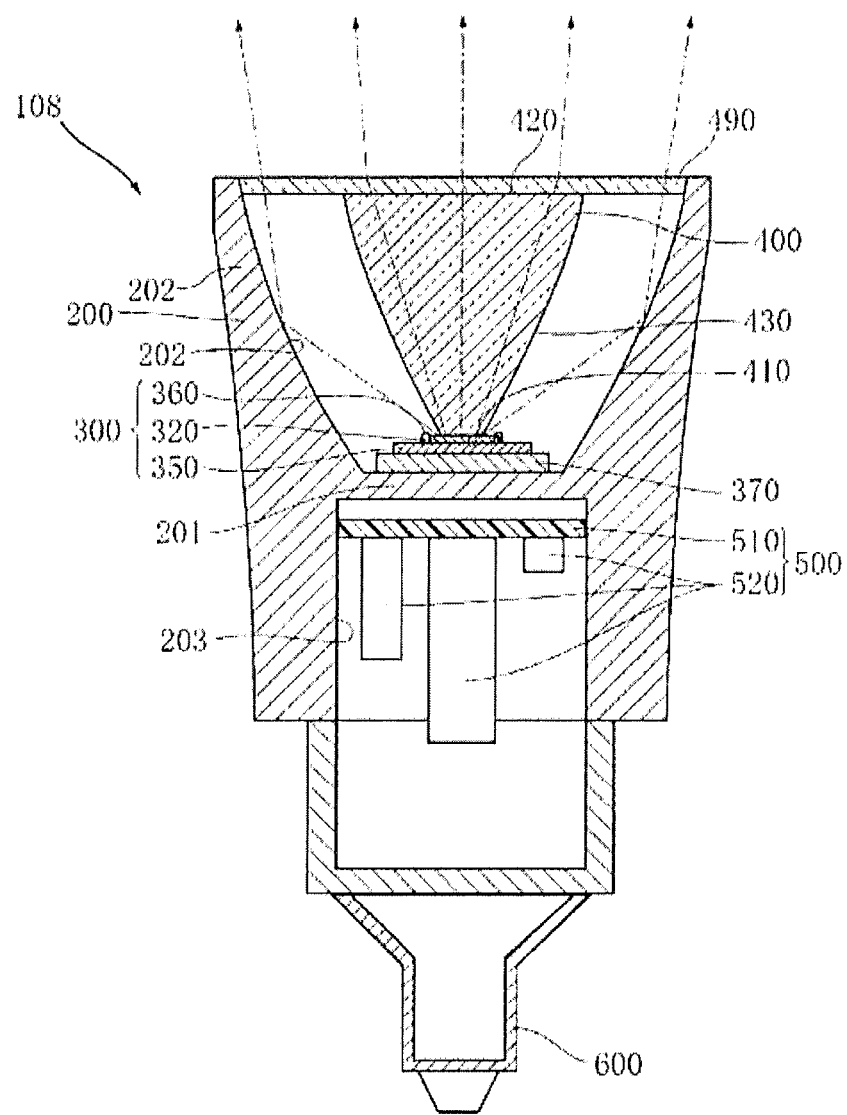
FIG. 21 is a cross-sectional view showing a LED bulb according to an eighth embodiment of the present invention.
Figure 22:
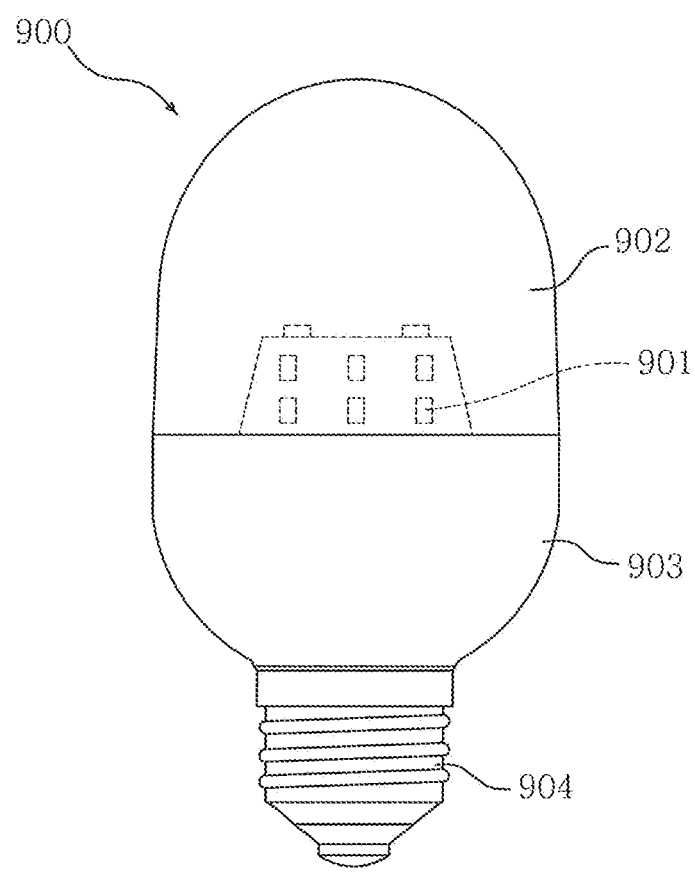
FIG. 22 is a plain view showing an example of a conventional LED bulb.

FIG. 21 shows a LED bulb according to an eighth embodiment of the present invention. The difference between the LED bulb 108 of this embodiment and the foregoing embodiments is the structure of the light guide body 400. In this embodiment, the size of the incident surface 410 of the light guide body 400 is smaller than that of the light-emitting surface 321 of the light-transmitting resin 320 of the light source portion 300. The light-emitting surface 321 is divided into a central portion connected with the incident surface 410 and a peripheral portion exposed from the incident surface 410. The size of the light-emitting surface 420 is determined based on the occurrence of a gap between the light-emitting surface 420 and the sidewall portion 202 of the housing 200. The inner side surface 204 of the sidewall portion 202 of the housing 200 is a bright white surface with white color or a metallic luster surface by disposing a metal film thereon. The opening of the housing 200 is blocked by a light-transmitting mask 490.

According to this embodiment, the LED bulb 108 may also be used as a replacement for the halogen lamp. The light coming from a portion of the light-emitting surface 321 of the light-transmitting resin 320 of the light source portion 300 that is in contact with the incident surface 410 of the light guide body 400 emits out from the light-emitting surface 420 toward the central area of the illumination field. On the other hand, the light coming from a portion of the light-emitting surface 321 that is exposed from the incident surface 410 travels in the space between the light guide body 400 and the sidewall portion 202 and is not incident to the light guide body 400. Then the light will passes through the light-transmitting mask 490 and emits out directly, or be reflected by the inner side surface 204 of the sidewall portion 202 then passes through the light-transmitting mask 490 and emits out directly. Therefore, the illuminance in the outer side within the illumination field can be raised. The preformation of bright white surface or metallic luster surface on the inner side surface of the sidewall portion 202 can facilitate raising the illuminance.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. An LED bulb, comprising:
a light source portion, comprising at least one LED chip;
a housing, comprising a bottom portion supporting the light source portion and a sidewall portion surrounding the light source portion, and opening at one side of a first direction;
a base, disposed on the other side of the first direction relative to the housing; and
a light guide body, disposed in a space surrounded by the sidewall portion, and comprising an incident surface facing the light source portion, a light-emitting surface for making the light from the incident surface emit toward the one side of the first direction, and a peripheral side surface located between the incident surface and the light-emitting surface, wherein a cross-sectional area of the peripheral side surface becomes increasingly larger from a side of the incident surface toward a side of the light-emitting surface.

2. The LED bulb according to claim 1, wherein the light source portion further comprises a light-transmitting resin covering the LED chip and allowing the light from the LED chip to pass through.

3. The LED bulb according to claim 2, wherein the light-transmitting resin contains a fluorescent material, the fluorescent material is excited by the light from the LED chip and emits a light having a wavelength that is different from the light from the LED chip.

4. The LED bulb according to claim 2, wherein the light-transmitting resin is in a shape of dome.

5. The LED bulb according to claim 4, wherein the light source portion further comprises a lead carrying the LED chip and a case covering at least one part of the lead.

6. The LED bulb according to claim 4, wherein the incident surface of the light guide body is a recessed surface that is recessed toward the one side of the first direction, and accommodates the light source portion.

7. The LED bulb according to claim 6, wherein the light-emitting surface of the light guide body comprises a recessed surface overlapping the incident surface as viewed in the first direction and being recessed toward the other side of the first direction.

8. The LED bulb according to claim 6, wherein the light-emitting surface of the light guide body comprises a plurality of lens surfaces, each being in shape of dome.

9. The LED bulb according to claim 2, wherein the light source portion further comprises a LED substrate carrying a plurality of LED chips, and a weir portion formed on the LED substrate to surround the LED chips; and the light-transmitting resin is formed in an area surrounded by the weir portion, and comprises a flat light-emitting surface toward the one side of the first direction.

10. The LED bulb according to claim 9, wherein the light-emitting surface of the light-transmitting resin is located further on the other side of the first direction than the end of weir portion at the one side of the first direction.

11. The LED bulb according to claim 10, wherein the light guide body further comprises a ring groove surrounding the incident surface and engaging the weir portion.

12. The LED bulb according to claim 9, wherein the incident surface of the light guide body is a recessed surface that is recessed toward the one side of the first direction and is spaced apart from the light-emitting surface of the light-transmitting resin.

13. The LED bulb according to claim 12, wherein the incident surface of the light guide body comprises a circular bottom surface and a side surface with a circular cross-section.

14. The LED bulb according to claim 12, wherein the light-emitting surface of the light guide body comprises a recessed surface overlapping the incident surface as viewed in the first direction and being recessed toward the other side of the first direction.

15. The LED bulb according to claim 12, wherein the light-emitting surface of the light guide body comprises a plurality of lens surfaces, each being in shape of dome.

16. The LED bulb according to claim 9, wherein the incident surface of the light guide body is smaller than the light-emitting surface of the light-transmitting resin.

17. The LED bulb according to claim 16, wherein the incident surface of the light guide body and the light-emitting surface of the light-transmitting resin are in contact with each other.

18. The LED bulb according to claim 16, wherein the sidewall portion is bright white.

19. The LED bulb according to claim 1, further comprising a holder having a shape of surrounding a part of the light guide body at the one side of the first direction, and the light guide body being held between the holder and the bottom portion of the housing; wherein the holder is mounted on the housing.

20. The LED bulb according to claim 19, wherein the housing further comprises a female screw formed on the sidewall portion, and the holder comprises a male screw threadably engaged with the female screw of the housing.

21. The LED bulb according to claim 1, wherein the housing further comprises a heat-dissipating element constituting the bottom portion and the sidewall portion and being made of metal.

22. The LED bulb according to claim 21, wherein the heat-dissipating element comprises a plurality of fins.

23. The LED bulb according to claim 21, further comprising a power source providing electric power to the LED chip; and the housing further comprising a power source accommodating portion mounted on the other side of the first direction relative to the heat-dissipating element, wherein the power source accommodating portion accommodates the power source and is made of resin.

24. The LED bulb according to claim 1, wherein the sidewall portion of the housing comprises an inner side surface surrounding the peripheral side surface of the light guide body with a gap therebetween.

25. The LED bulb according to claim 24, wherein the cross-sectional area of the inner side surface becomes increasingly larger toward the one side of the first direction.

26. The LED bulb according to claim 24, wherein the inner side surface is a bright white surface or a metallic luster surface.

* * * * *